(12) United States Patent
Goo et al.

(10) Patent No.: US 11,270,744 B2
(45) Date of Patent: Mar. 8, 2022

(54) SEMICONDUCTOR MEMORY DEVICE CONFIGURED TO OUTPUT DATA BASED ON A WARM-UP CYCLE AND OPERATING METHOD THEREOF

(71) Applicant: SK hynix Inc., Icheon-si (KR)

(72) Inventors: Ja Yoon Goo, Suwon-si (KR); Sung Hwa Ok, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 40 days.

(21) Appl. No.: 16/872,072

(22) Filed: May 11, 2020

(65) Prior Publication Data

US 2021/0158848 A1 May 27, 2021

(30) Foreign Application Priority Data

Nov. 21, 2019 (KR) .................. 10-2019-0150801

(51) Int. Cl.
*G11C 7/20* (2006.01)
*G11C 7/10* (2006.01)
*G06F 9/30* (2018.01)

(52) U.S. Cl.
CPC ............ *G11C 7/20* (2013.01); *G06F 9/30029* (2013.01); *G06F 9/30065* (2013.01); *G11C 7/1012* (2013.01); *G11C 7/1051* (2013.01); *G11C 7/1078* (2013.01)

(58) Field of Classification Search
CPC ... G11C 16/00–3495; G11C 7/20; G11C 7/22; G11C 7/1012; G11C 7/1051; G11C 7/1078
See application file for complete search history.

(56) References Cited

U.S. PATENT DOCUMENTS

2018/0277180 A1* 9/2018 Yoshida ................. G11C 16/08

FOREIGN PATENT DOCUMENTS

| KR | 100665232 B1 | 1/2007 |
|---|---|---|
| KR | 100868016 B1 | 11/2008 |

* cited by examiner

*Primary Examiner* — Alfredo Bermudez Lozada
(74) *Attorney, Agent, or Firm* — William Park & Associates Ltd.

(57) ABSTRACT

A semiconductor memory device operated under control of a controller. The semiconductor memory device including a control logic and a data input/output circuit. The control logic configured to store logic data and generate a plurality of pieces of circular data based on the logic data in response to an output command of the logic data that is received from the controller. The data input/output circuit configured to select circular data corresponding to a set warm-up cycle among the plurality of pieces of circular data and output the selected circular data to the controller.

15 Claims, 13 Drawing Sheets

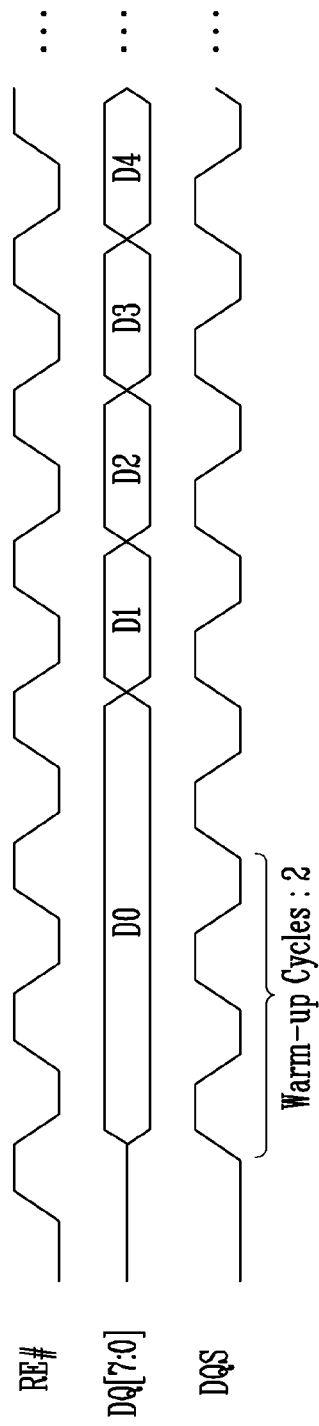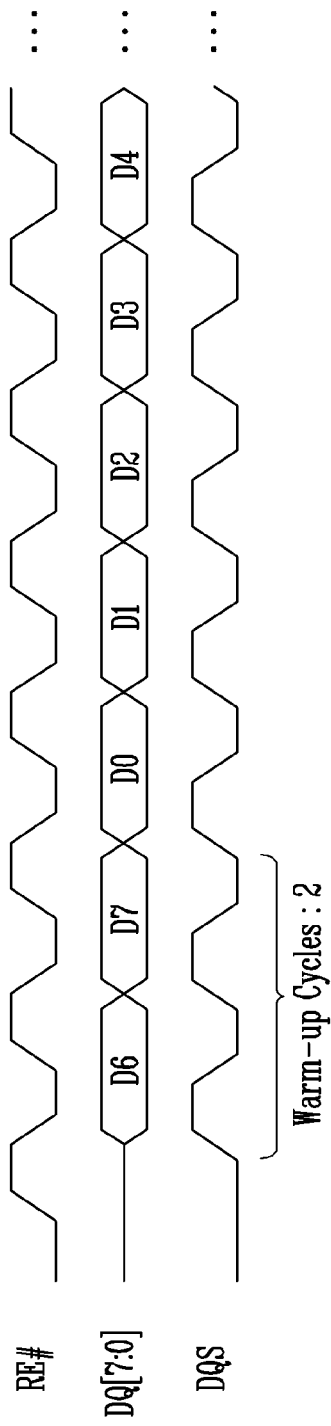

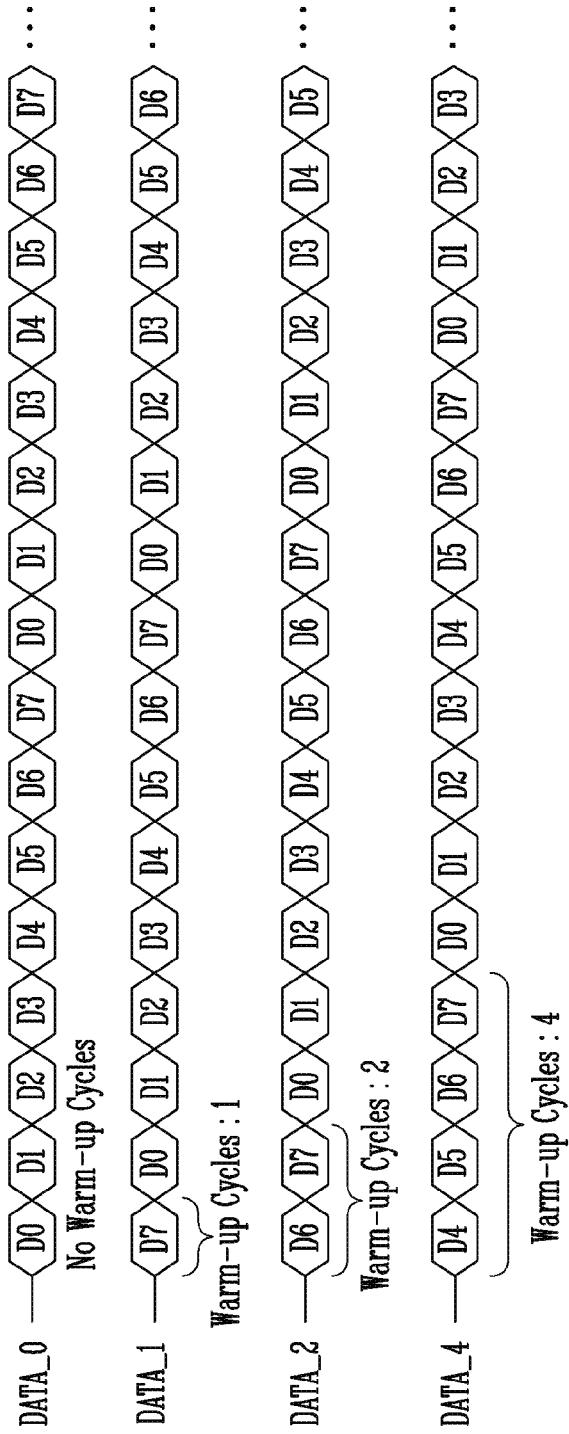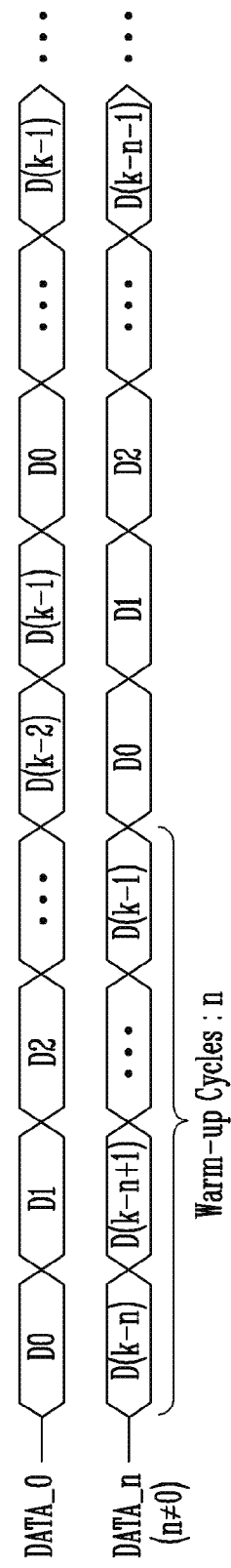

FIG. 9

|     | D0   | D1   | D2   | D3   | D4   | D5   | D6   | D7   |
|-----|------|------|------|------|------|------|------|------|
| DQ0 | B0_0 | B0_1 | B0_2 | B0_3 | B0_4 | B0_5 | B0_6 | B0_7 |
| DQ1 | B1_0 | B1_1 | B1_2 | B1_3 | B1_4 | B1_5 | B1_6 | B1_7 |
| DQ2 | B2_0 | B2_1 | B2_2 | B2_3 | B2_4 | B2_5 | B2_6 | B2_7 |
| DQ3 | B3_0 | B3_1 | B3_2 | B3_3 | B3_4 | B3_5 | B3_6 | B3_7 |
| DQ4 | B4_0 | B4_1 | B4_2 | B4_3 | B4_4 | B4_5 | B4_6 | B4_7 |
| DQ5 | B5_0 | B5_1 | B5_2 | B5_3 | B5_4 | B5_5 | B5_6 | B5_7 |
| DQ6 | B6_0 | B6_1 | B6_2 | B6_3 | B6_4 | B6_5 | B6_6 | B6_7 |
| DQ7 | B7_0 | B7_1 | B7_2 | B7_3 | B7_4 | B7_5 | B7_6 | B7_7 |

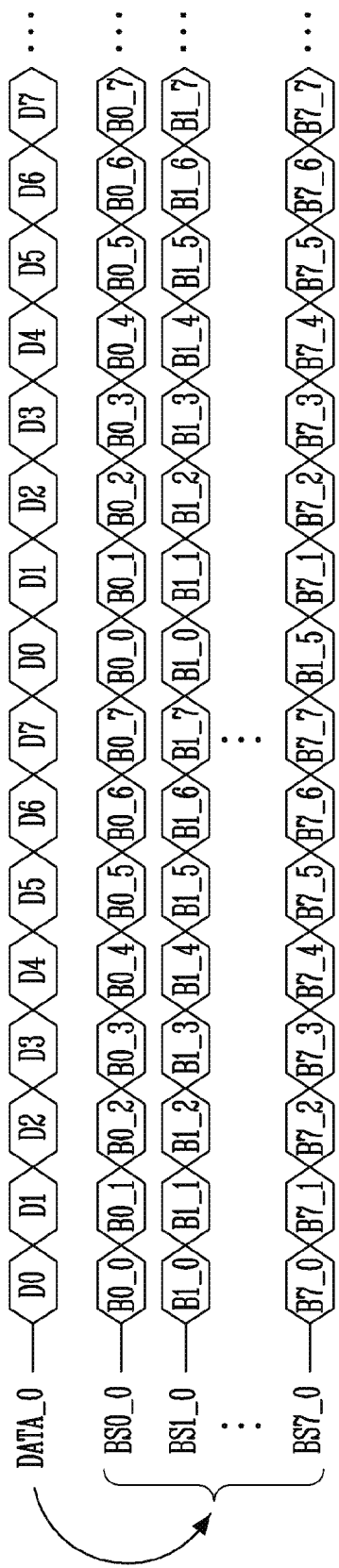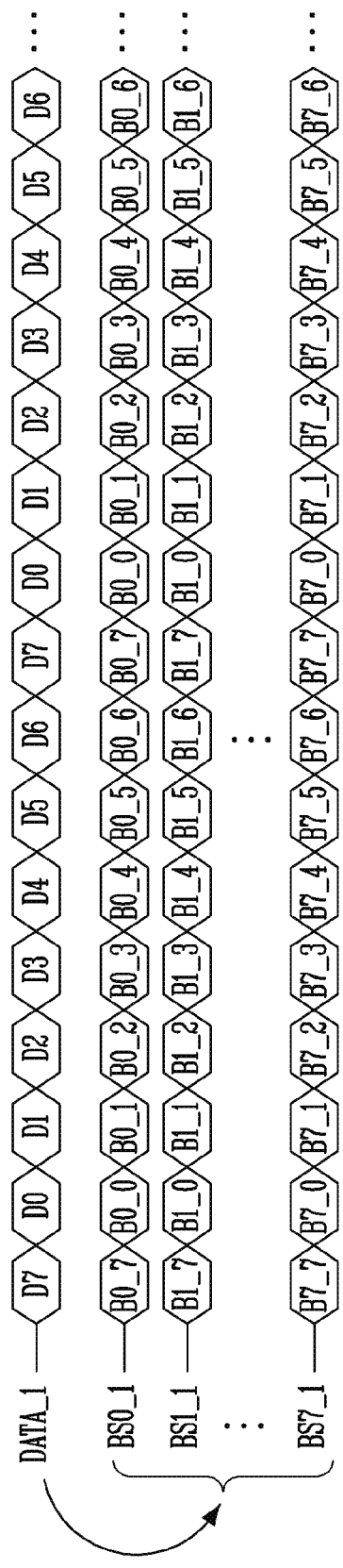

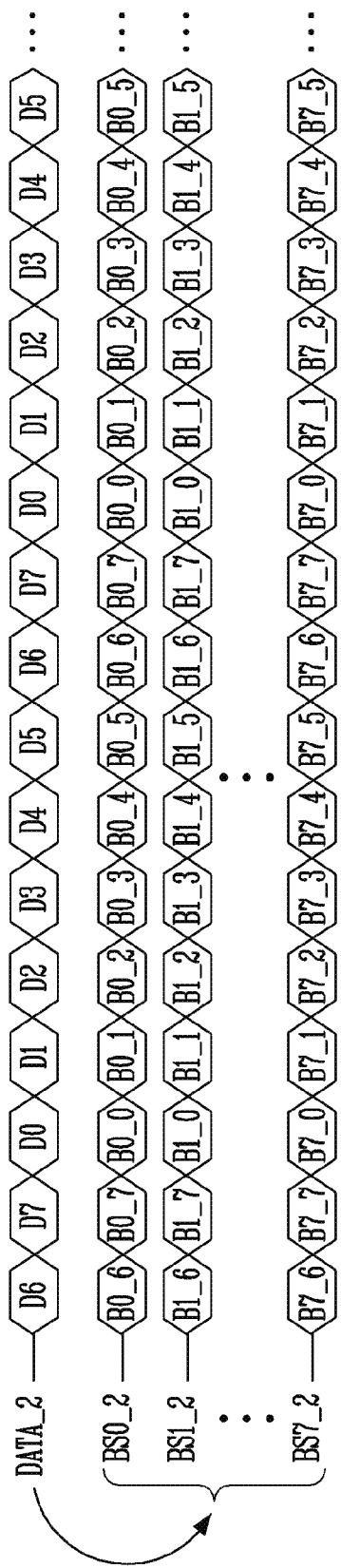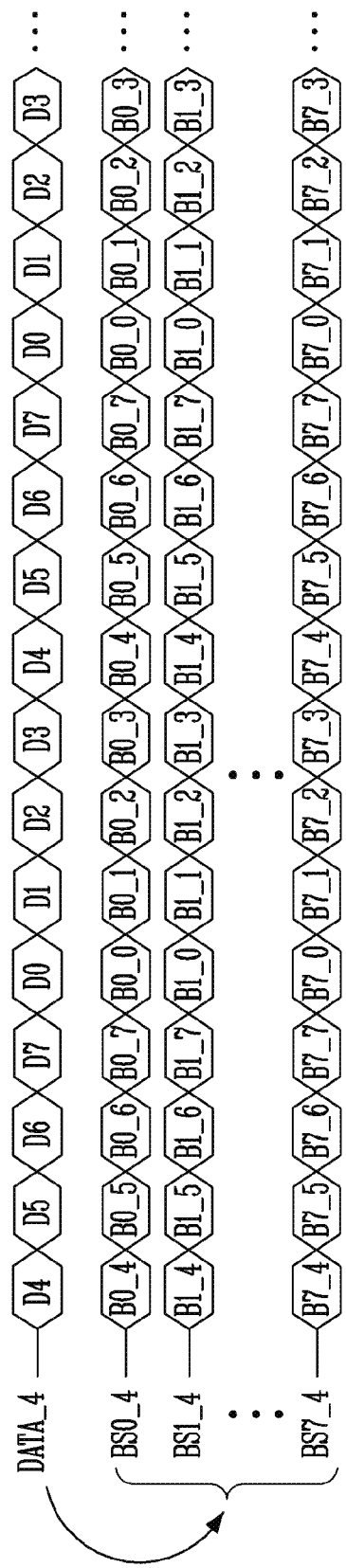

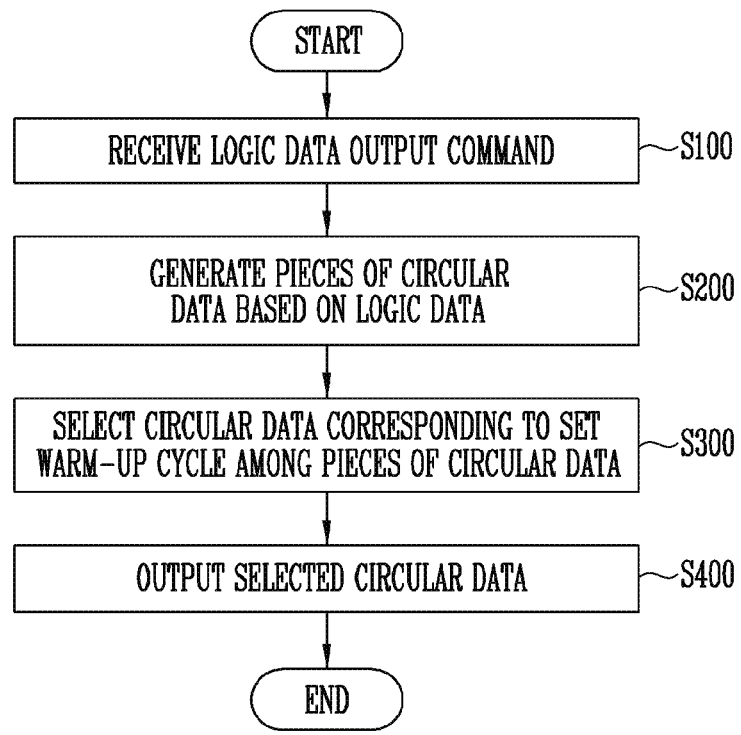

SEMICONDUCTOR MEMORY DEVICE CONFIGURED TO OUTPUT DATA BASED ON A WARM-UP CYCLE AND OPERATING METHOD THEREOF

CROSS-REFERENCE TO RELATED APPLICATION

The present application claims priority under 35 U.S.C. § 119(a) to Korean patent application number 10-2019-0150801 filed on Nov. 21, 2019, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

Generally, a semiconductor memory device may have a two-dimensional structure in which strings are horizontally arranged on a semiconductor substrate, or a three-dimensional structure in which strings are vertically stacked on a semiconductor substrate. The three-dimensional semiconductor memory device may be a device which is devised to overcome a limitation in the degree of integration of the two-dimensional semiconductor memory device, and may include a plurality of memory cells which are vertically stacked on a semiconductor substrate.

A controller may control the operation of the semiconductor memory device.

SUMMARY

An embodiment of the present disclosure may provide for a semiconductor memory device may be operated under control of a controller. The semiconductor memory device may include a control logic and a data input and output circuit. The control logic may store logic data and generate a plurality of pieces of circular data based on the logic data in response to an output command of the logic data, the output command being received from the controller. The data input and output (input/output) circuit may select circular data corresponding to a set warm-up cycle among the plurality of pieces of circular data and output the selected circular data to the controller.

The control logic may include: a logic data storage, a circular data generator, a parameter storage, and a control signal generator. The logic data storage may store the logic data. The circular data generator may generate a plurality of pieces of circular data corresponding to a plurality of warm-up cycles based on the logic data, and output the circular data to the data input/output circuit. The parameter storage may store a set warm-up cycle value. The control signal generator may generate a control signal for controlling an operation of the data input/output circuit based on the set warm-up cycle value.

An embodiment of the present disclosure may provide for a method of operating a semiconductor memory device configured to communicate with a controller, the method may include: receiving an output command of logic data from the controller; generating a plurality of pieces of circular data based on the logic data; selecting circular data corresponding to a set warm-up cycle among the plurality of pieces circular data; and outputting the selected circular data.

BRIEF DESCRIPTION OF THE DRAWINGS

FIG. 2 is a timing diagram illustrating data output according to a warm-up cycle in a typical semiconductor memory device.

FIG. 3 is a timing diagram illustrating output of logic data according to a warm-up cycle in a semiconductor memory device in accordance with an embodiment of the present disclosure.

FIG. 7 is a timing diagram illustrating a plurality of pieces of circular data generated by a circular data generator.

FIG. 8 is a timing diagram more generally illustrating a plurality of pieces of circular data generated by the circular data generator.

FIG. 9 is a table illustrating pieces of bit data included in the circular data.

FIGS. 10A, 10B, 10C, and 10D are timing diagrams illustrating bit data included in each piece of circular data illustrated in FIG. 7.

FIG. 13 is a table illustrating control signals CTRL_0 to CTRL_4 according to a warm-up cycle.

FIG. 14 is a flowchart illustrating a method of operating the semiconductor memory device in accordance with an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure may be directed to a semiconductor memory device having a minimized implementation area.

Various embodiments of the present disclosure may be directed to a method of operating a semiconductor memory device having a minimized implementation area.

Figure 1:
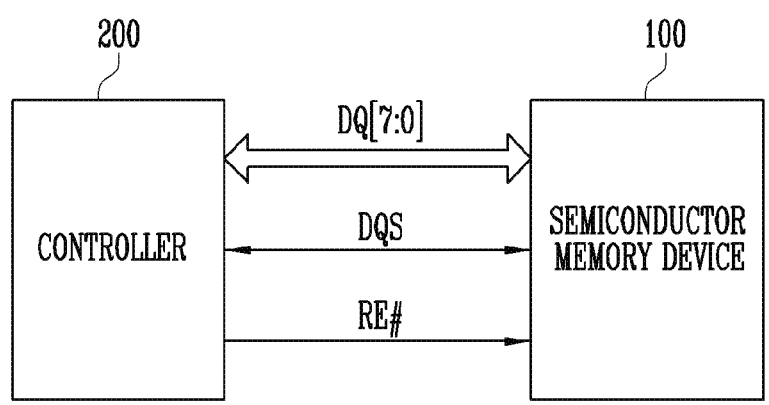
FIG. 1 is a block diagram illustrating a storage device including a semiconductor memory device in accordance with an embodiment of the present disclosure.

FIG. 1 is a block diagram illustrating a storage device 1000 including a semiconductor memory device 100 in accordance with an embodiment of the present disclosure.

Referring FIG. 1, the storage device 1000 includes a semiconductor memory device 100 and a controller 200. The semiconductor memory device 100 may operate under control of the controller 200. For example, the semiconductor memory device 100 may write data to the memory cell array 110 (see FIG. 4) in response to a write request from the controller 200. If a write command, an address, and data are received in response to a write request from the controller 200, the semiconductor memory device 100 may write data to memory cells indicated by the address.

In response to a read request from the controller 200, the semiconductor memory device 100 may perform a read operation. If a read command and an address are received in response to a read request from the controller 200, the semiconductor memory device 100 may read data from memory cells indicated by the address and output the read data to the controller 200.

The semiconductor memory device 100 takes many alternative forms, such as a NAND flash memory, a vertical NAND flash memory (hereinafter, referred to as 'VNAND flash memory'), a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may be applied not only to a flash memory in which a charge storage layer is formed of a conductive floating gate, but also to a charge trap flash (CTF) memory in which a charge storage layer is formed of an insulating layer.

The controller 200 is coupled between the semiconductor memory device 100 and a host. The controller 200 may interface the host and the semiconductor memory device 100. The controller 200 may transmit a write request or a read request to the semiconductor memory device 100 under control of the host.

A data input/output (DQ[7:0]) line, a data strobe (DQS) line, and a read enable (RE #) line may be used to perform a data transfer operation between the controller 200 and the semiconductor memory device 100, particularly, an operation of outputting data from the semiconductor memory device 100. The data input/output (DQ[7:0]) line may include zeroth to seventh data input/output (DQ0 to DQ7) lines. A read enable signal RE #may be toggled by the controller 200 when data is output from the semiconductor memory device 100. The read enable signal RE #may be a signal which is transmitted from the controller 200 to the semiconductor memory device 100.

The data input/output (DQ0 to DQ7) lines may be used to input a command, an address and data from the controller 200 to the semiconductor memory device 100 or output data from the semiconductor memory device 100 to the controller 200. In an embodiment of FIG. 1, the data may be formed of 8 bits, and there are eight data input/output lines DQ0 to DQ7. However, the number of the data input/output lines is not limited to eight, and it may be expanded to sixteen or thirty-two in various embodiments.

The data strobe (DQS) signal may be a bidirectional signal. During a data output operation of the semiconductor memory device 100, the data strobe (DQS) signal may be driven by the semiconductor memory device 100. On the other hand, while data is input to the semiconductor memory device 100, the data strobe (DQS) signal may be driven by the controller 200.

During such a data transfer operation between the controller 200 and the semiconductor memory device 100, a warm-up cycle may be used. The warm-up cycle used during the data transfer operation will be described below with reference to FIGS. 2 and 3. The warm-up cycle may be 0, 1, 2, or 4. In the case where the warm-up cycle is 0, this may mean that a warming-up operation is not performed during the data transfer operation.

FIG. 2 is a timing diagram illustrating data output according to a warm-up cycle in a typical semiconductor memory device. Referring to FIG. 2, there are illustrated a read enable (RE #) signal, a data strobe (DQS) signal, and data that is output through the data input/output (DQ[7:0]) line.

Referring to FIG. 2, the read enable (RE #) signal is input to the semiconductor memory device 100. Subsequently, data is output through the data input/output (DQ[7:0]) line in response to the data strobe (DQS) signal. FIG. 2 is a timing diagram of the case where the warm-up cycle is set to a 2-cycle. For example, the warm-up cycle is set to be two cycles of the data strobe signal.

Since the warm-up cycle is a 2-cycle (i.e., is 2 cycles of the data strobe signal), dummy data may be output during first two cycles of the data strobe (DQS) signal. The controller 200 may ignore data output during the first two cycles of the data strobe (DQS) signal. Therefore, during the warm-up cycle, the semiconductor memory device may output any dummy data. In accordance with the typical technique, the semiconductor memory device may output zeroth data D0 during the warm-up cycle. The zeroth data D0 may be first data among successive pieces of data that are output from the semiconductor memory device. The zeroth data D0 may be data that is output through the data input/output (DQ[7:0]) line while the data strobe (DQS) signal of the first cycle is output. Hence, the zeroth data D0 may be 8-bit data.

If the warm-up cycle has passed, the semiconductor memory device may output valid data. In other words, data that can be validly received to the controller 200 may be substantially output from a third cycle of the data strobe (DQS) signal. In the third cycle of the data strobe (DQS) signal, the zeroth data D0 may be output. In a fourth cycle, the first data D1 may be output. In a fifth cycle, the second data D2 may be output. In a sixth cycle, the third data D3 may be output. In a seventh cycle, the fourth data D4 may be output. Each of the first to fourth data D1 to D4 may be 8-bit data. Data that is output in a subsequent cycle of the data strobe (DQS) signal may also be 8-bit data.

As illustrated in FIG. 2, in the typical semiconductor memory device, during the data strobe (DQS) cycle corresponding to the first and second cycles related with the warm-up cycle, the zeroth data D0 may be output as dummy data through the data input/output (DQ[7:0]) line. Furthermore, the typical semiconductor memory device may sequentially output zeroth to fourth data D0 to D4 through the data input/output (DQ[7:0]) line from the first cycle after the warm-up cycle has passed. As such, during the warm-up cycle and the valid first cycle of the data strobe (DQS) signal, the same zeroth data D0 may be output. From a subsequent cycle, a complex circuit may be needed to output the first data D1 and subsequent data.

In the present disclosure, in the case of data that is repeatedly input at a predetermined cycle, circular data may be generated and output based on the warm-up cycle. Parameter data of the semiconductor memory device 100, except data stored in the memory cell array, may be data having a relatively small size. The parameter data may be stored in a register or the like rather than in the memory cell array. For example, in the case where the controller 200 transmits a command such as ReadID (90h) or Get Feature (EEh) to the semiconductor memory device 100, the semiconductor memory device 100 may output data stored in an internal register to the controller 200 without performing a read operation on the memory cell array. The data that is stored in the internal register rather than in the memory cell array may be designated as logic data. The logic data may be data having a relatively small size. When the logic data is output, the semiconductor memory device 100 may repeatedly output the same data. The word "predetermined" as used herein with respect to a parameter, such as a predetermined cycle, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The semiconductor memory device 100 in accordance with an embodiment may generate the circular data from the logic data based on the warm-up cycle. The circular data may be data circular-shifted by the number of warm-up cycles. The semiconductor memory device 100 may output the generated circular data in response to the data strobe (DQS) signal. The circular data based on the number of warm-up cycles may be generated using the logic data through a simple gate operation. Therefore, in the storage device 1000 to which the warm-up cycle is applied, data corresponding to the set warm-up cycle may be output based on a simple circuit. Consequently, the complexity of the semiconductor memory device 100 and the storage device 1000 including the semiconductor memory device 100 may be reduced.

FIG. 3 is a timing diagram illustrating output of logic data according to the warm-up cycle in the semiconductor memory device 100 in accordance with an embodiment of the present disclosure. Referring to FIG. 3, there are illustrated a read enable (RE #) signal, a data strobe (DQS) signal, and data that is output through the data input/output (DQ[7:0]) line. The read enable (RE #) signal and the data strobe (DQS) signal of FIG. 3 may be substantially the same as those of FIG. 2.

In FIG. 3, since the warm-up cycle is a 2-cycle, dummy data may be output during first two cycles of the data strobe (DQS) signal. The controller 200 may ignore data output during the first two cycles of the data strobe (DQS) signal. Therefore, during the warm-up cycle, the semiconductor memory device 100 may output any dummy data. The semiconductor memory device 100 in accordance with an embodiment may output sixth and seventh data D6 and D7 during the warm-up cycle.

If the warm-up cycle has passed, the semiconductor memory device 100 may output valid data. In other words, data that can be validly received to the controller 200 may be substantially output from the third cycle of the data strobe (DQS) signal. In the third cycle of the data strobe (DQS) signal, the zeroth data D0 may be output. In a fourth cycle, the first data D1 may be output. In a fifth cycle, the second data D2 may be output. In a sixth cycle, the third data D3 may be output. In a seventh cycle, the fourth data D4 may be output.

Although not illustrated in FIG. 3, after the fourth data D4 has been output, fifth to seventh data D5 to D7 may be sequentially output. In other words, in an eighth cycle of the data strobe (DQS) signal, the fifth data D5 may be output. In a ninth cycle, the sixth data D6 may be output. In a tenth cycle, the seventh data D7 may be output. Thereafter, the first data D1 may be output again in an eleventh cycle of the data strobe (DQS) signal.

As described above, the logic data may be data that is stored in the internal register of the semiconductor memory device 100. The logic data may have a relatively small size compared to user data that is stored in the memory cell array. Referring to FIG. 3, the logic data may be data that is output during eight cycles of the data strobe (DQS) signal through the data input/output (DQ[7:0]) line. Since each of the zeroth to seventh data D0 to D7 included in the logic data is 8-bit data, the logic data may be entire 64-bit data.

As described above, the semiconductor memory device 100 in accordance with an embodiment may generate circular data based on the warm-up cycle when the logic data is output, and output the generated circular data through the data input/output (DQ[7:0]) line in response to the data strobe (DQS) signal. Therefore, the implement complexity of the semiconductor memory device 100 may be reduced.

Figure 4:
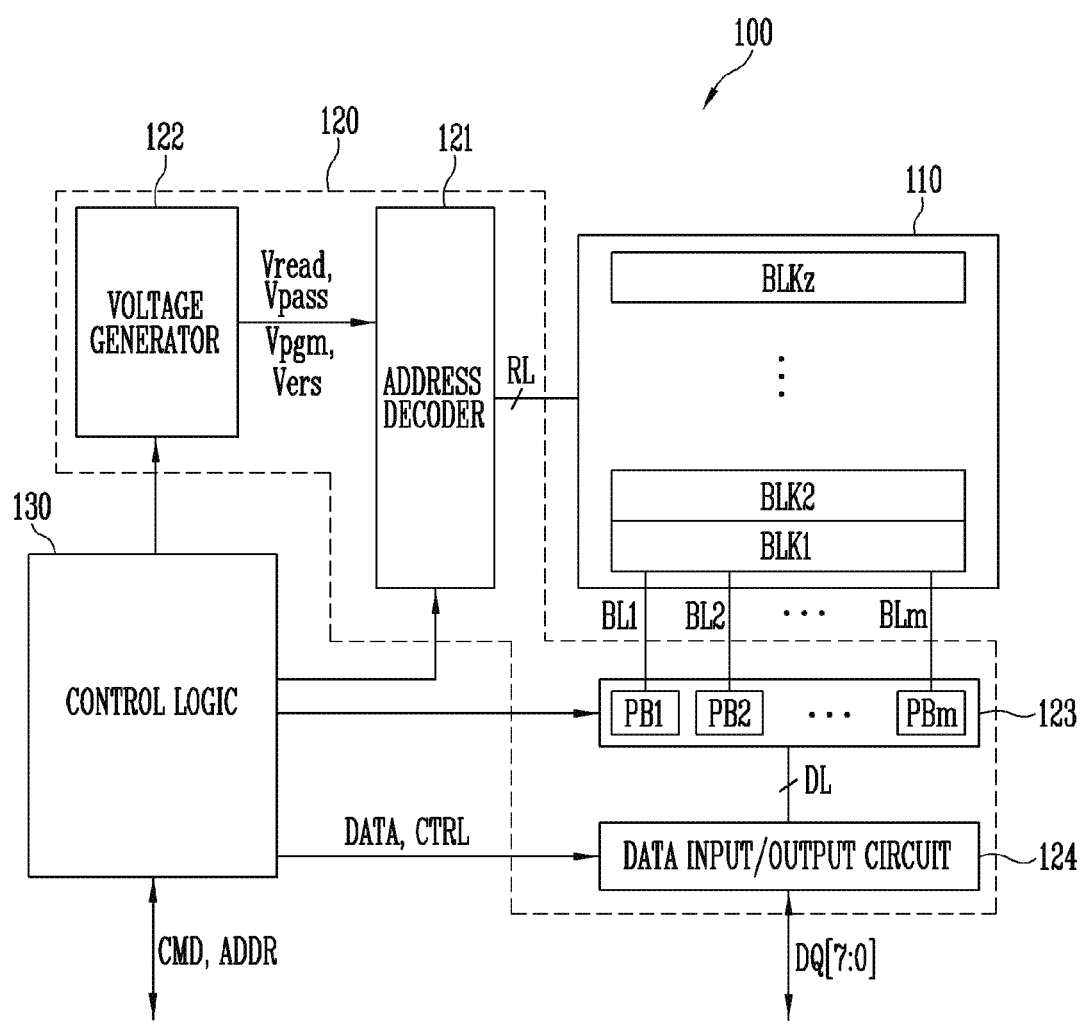
FIG. 4 is a block diagram illustrating the configuration of the semiconductor memory device of FIG. 1.

FIG. 4 is a block diagram illustrating the configuration of the semiconductor memory device 100 of FIG. 1.

Referring to FIG. 4, the semiconductor device 100 may include a memory cell array 110, a peripheral circuit 120, and control logic 130. The peripheral circuit 120 may include an address decoder 121, a voltage generator 122, a read and write (read/write) circuit 123, and a data input/output circuit 124. The control logic 130 may be implemented as hardware, software, or a combination of hardware and software. For example, the control logic 130 may be a control logic circuit operating in accordance with an algorithm and/or a processor executing control logic code.

The memory cell array 110 is coupled to the address decoder 121 through row lines RL and coupled to the read/write circuit 123 through bit lines BL1 to BLm. The row lines RL may include a source select line, a word line, and a drain select line.

The memory cell array 110 may include a plurality of memory blocks BLK1 to BLKz. The plurality of memory blocks BLK1 to BLKz are coupled to the address decoder 200 through row lines RL. The plurality of memory blocks BLK1 to BLKz are coupled to the read/write circuit 123 through the bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, each of the memory blocks included in the memory cell array 110 may be formed of a plurality of pages.

Each of the memory cells of the semiconductor memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The address decoder 121 may operate under control of the control logic 130. For example, the address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to at least one word line WL according to the decoded row address.

During a program operation, the address decoder 121 may apply a program voltage Vpgm to a selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage Vread to a selected word line and apply a pass voltage Vpass higher than the read voltage Vread to unselected word lines.

In an embodiment, the erase operation of the semiconductor memory device 100 may be performed on a memory block basis. During an erase operation, an address ADDR to be input to the semiconductor memory device 100 includes a block address. The address decoder 121 may decode the block address and select a corresponding memory block according to the decoded block address. During an erase operation, the address decoder 121 may apply a ground voltage to a word line coupled to the selected memory block and apply an erase voltage Vers to a bulk area in which the selected memory block is formed.

In an embodiment, the address decoder 121 may decode a column address among the transmitted addresses ADDR. A decoded column address DCA may be transmitted to the read/write circuit 123. For example, the address decoder 121 may include components such as a row decoder, a column decoder, and an address buffer.

The voltage generator 122 may generate various voltages needed to perform operations of the semiconductor memory device 100. For example, the voltage generator 122 may generate, for example, a read voltage Vread, a pass voltage Vpass, a program voltage Vpgm, or an erase voltage Vers, and transmit the generated voltage to the address decoder 121.

For example, the voltage generator 122 may include a plurality of pumping capacitors and generate a plurality of voltages by selectively activating the plurality of pumping capacitors under control of the control logic 130. The generated voltages may be supplied to the memory cell array 110 by the address decoder 121.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated in response to a control signal CTR1 received from the control logic 130.

The first to m-th page buffers PB1 to PBm may perform data communication with the data input/output circuit 124. During a program operation, the first to m-th page buffers PB1 to PBm may receive data to be stored through the data input/output circuit 124 and data lines DL.

During the program operation, the first to m-th page buffers PB1 to PBm may transmit the data, received through the data input/output circuit 124, to selected memory cells through the bit lines BL1 to BLm when a program pulse is applied to a selected word line. The memory cells in the selected page are programmed based on the transmitted data. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data from the memory cells in the selected page through the bit lines BL, and output the read data to the data input/output circuit 124.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate in response to a control signal CTRL received from the control logic 130. During a program operation, the data input/output circuit 124 may receive data to be stored from an external controller (not illustrated). During a read operation, the data input/output circuit 124 may output data, transmitted from the first to m-th page buffers PB1 to PBm included in the read/write circuit 123, to the external controller.

The control logic 130 may control the overall operation of the semiconductor memory device 100. The control logic 130 may operate in response to a command CMD transmitted from an external device. The control logic 130 may be coupled to the address decoder 121, the voltage generator 122, the read/write circuit 123, and the data input/output circuit 124.

As described above, the semiconductor memory device 100 may store logic data in the internal register rather than in the memory cell array 110. On the other hand, user data may be stored in the memory cell array 110 through a program operation.

The control logic 130 may include the internal register configured to store the logic data. When the controller 200 transmits an output command of the logic data to the semiconductor memory device 100, the logic data stored in the internal register of the control logic 130 may be output to the controller 200 through the data input/output circuit 124 and the data input/output (DQ[7:0]) line.

Figure 5:
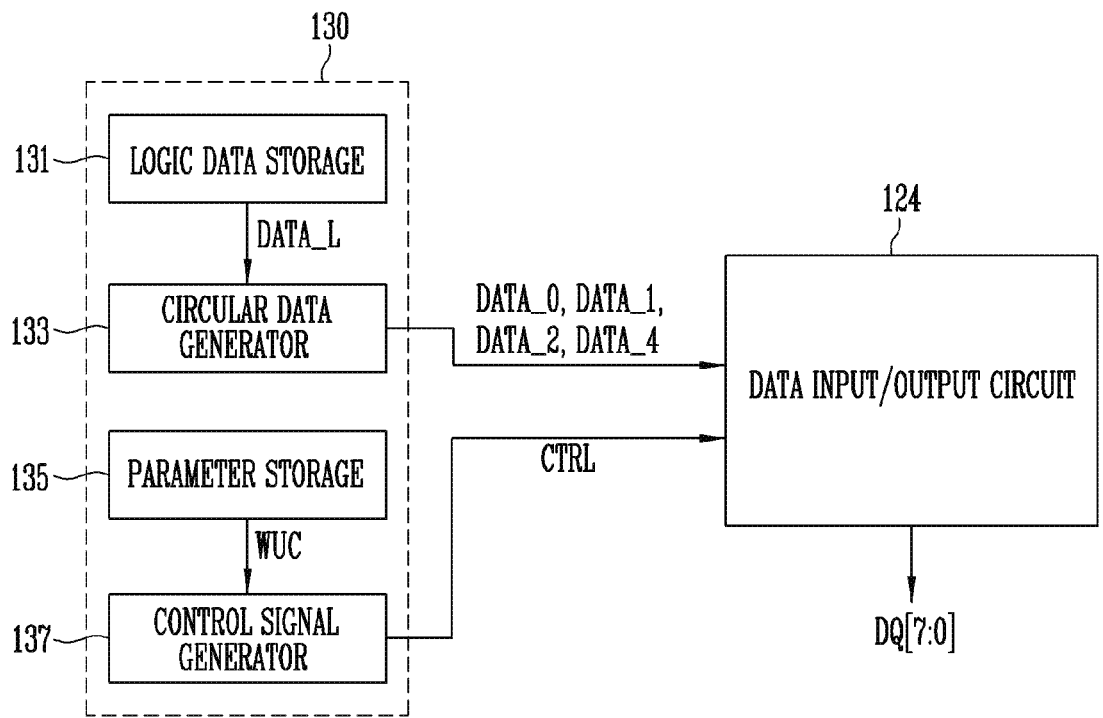
FIG. 5 is a block diagram illustrating the configuration of the control logic and the data input/output circuit of the semiconductor memory device in accordance with an embodiment of the present disclosure.

FIG. 5 is a block diagram illustrating the configuration of the control logic 130 and the data input/output circuit 124 of the semiconductor memory device 100 in accordance with an embodiment of the present disclosure.

Referring to FIG. 5, the control logic 130 may include a logic data storage 131, a circular data generator 133, a parameter storage 135, and a control signal generator 137.

The logic data storage 131 may be implemented as the above-mentioned internal register. The logic data storage 131 may store logic data DATA_L. When a command for outputting the logic data from the controller 200 is received, the logic data storage 131 may output the logic data DATA_L to the circular data generator 133.

The circular data generator 133 may generate a plurality of circular data DATA_0, DATA_1, DATA_2, and DATA_4 that are iterated for each predetermined period, based on the logic data DATA_L. The predetermined period may be determined depending on the size of the logic data DATA_L. For example, in the case where the logic data DATA_L is a 64-bit size, the size of data capable of being output through the data input/output (DQ[7:0]) line for one cycle of the data strobe signal DQS corresponds to 8 bits. Therefore, the period may correspond to 8 cycles of the data strobe signal DQS.

The plurality of circular data DATA_0, DATA_1, DATA_2, and DATA_4 that are generated by the circular data generator 133 may be circular data corresponding to a plurality of warm-up cycles. The plurality of circular data DATA_0, DATA_1, DATA_2, and DATA_4 that are generated by the circular data generator 133 will be described below with reference to FIGS. 7 and 8.

The parameter storage 135 may store a preset warm-up cycle (WUC) value. In the case where the semiconductor memory device 100 receives an output command of data from the controller 200, the parameter storage 135 may transmit the warming-up cycle (WUC) value to the control signal generator.

FIG. 5 illustrates that the logic data storage 131 and the parameter storage 135 are separate components. However, the present disclosure is not limited thereto. The logic data storage 131 and the parameter storage 135 may be implemented as a single integrated storage. In this case, the integrated storage may include both the logic data DATA_L and the warm-up cycle WUC values.

The control signal generator 137 may generate a control signal CTRL based on the received warm-up cycle WUC value. The data input/output circuit 124 may select, based on the control signal CTRL corresponding to the set warm-up cycle WUC value, any one of the plurality of pieces of circular data and output the selected circular data through the data input/output (DQ[7:0]) line.

The configuration of the data input/output circuit 124 will be described below with reference to FIGS. 9 to 11.

Figure 6:
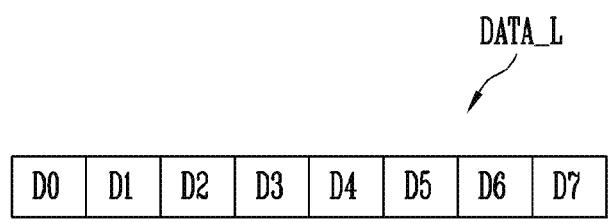
FIG. 6 is a diagram illustrating an example of logic data stored in a logic data storage.

FIG. 6 is a diagram illustrating an example of the logic data stored in the logic data storage 131.

Referring to FIG. 6, the logic data DATA_L may include zeroth to seventh data D0 to D7. In an embodiment, each of the zeroth to seventh data D0 to D7 may be unit data that is output through the data output (DQ[7:0]) line for one cycle of the data strobe (DQS) signal. In a single data rate (SDR) mode, 8-bit data may be output through the data output (DQ[7:0]) line for one cycle of the data strobe (DQS) signal. Hence, in this case, each of the zeroth to seventh data D0 to D7 may be 8-bit data. Therefore, the logic data DATA_L may be 64-bit data.

In an embodiment, each of the zeroth to seventh data D0 to D7 may be unit data that is output through the data input/output (DQ[7:0]) line for a half cycle of the data strobe (DQS) signal. In a double data rate (DDR) mode, 8-bit data may be output through the data output (DQ[7:0]) line for 0.5 cycle of the data strobe (DQS) signal.

Hereinafter, it is assumed that the semiconductor memory device 100 and the controller 200 are operated in the SDR mode.

Although FIG. 6 illustrates that the logic data DATA_L includes 8 pieces of unit data, the present disclosure is not limited thereto. In an embodiment, the number of pieces of unit data included in the logic data may be changed in various ways.

FIG. 7 is a timing diagram illustrating a plurality of pieces of circular data generated by the circular data generator 133.

Referring to FIG. 7, there are illustrated four pieces of circular data DATA_0, DATA_1, DATA_2, and DATA_4. All of the pieces of the circular data DATA_0, DATA_1, DATA_2, and DATA_4 may be generated based on the logic data DATA_L. Also, each of the pieces of the circular data DATA_0, DATA_1, DATA_2, and DATA_4 may be generated based on a corresponding warm-up cycle.

The circular data DATA_0 may be data generated when the warm-up cycle is 0, i.e., the case where the warm-up cycle is not used. In this case, the circular data DATA_0 may start from the zeroth data D0. In other words, the circular data DATA_0 may be data in which the zeroth to seventh data D0 to D7 included in the logic data DATA_L stored in the logic data storage 131 are sequentially and repeatedly disposed. In the case where the warm-up cycle is 0, the zeroth data D0 may be output from the first cycle of the data strobe (DQS) signal.

The circular data DATA_1 may be data generated when the warm-up cycle is 1. In this case, the circular data DATA_1 may start from the seventh data D7. In other words, the circular data DATA_1 may include the seventh data D7 and the zeroth to seventh data D0 to D7 that are repeatedly disposed. In the case where the warm-up cycle is 1, the seventh data D7 may be output on the first cycle of the data strobe (DQS) signal. Here, the controller 200 may ignore the seventh data D7 received on the first cycle of the data strobe (DQS) signal. The zeroth to seventh data D0 to D7 may be sequentially output from the second cycle of the data strobe (DQS) signal. The controller 200 may normally receive the zeroth to seventh data D0 to D7 that are output from the second cycle of the data strobe (DQS) signal. Hence, the logic data DATA_L may be transmitted from the semiconductor memory device 100 to the controller 200.

The circular data DATA_2 may be data generated when the warm-up cycle is 2. In this case, the circular data DATA_2 may start from the sixth data D6. In other words, the circular data DATA_2 may include the sixth and seventh data D6 and D7 and the zeroth to seventh data D0 to D7 that are repeatedly disposed. In the case where the warm-up cycle is 2, the sixth data D6 may be output on the first cycle of the data strobe (DQS) signal, and the seventh data D7 may be output on the second cycle. Here, the controller 200 may ignore the sixth and seventh data D6 and D7 received on the first and second cycles of the data strobe (DQS) signal. The zeroth to seventh data D0 to D7 may be sequentially output from the third cycle of the data strobe (DQS) signal. The controller 200 may normally receive the zeroth to seventh data D0 to D7 that are output from the third cycle of the data strobe (DQS) signal. Hence, the logic data DATA_L may be transmitted from the semiconductor memory device 100 to the controller 200.

The circular data DATA_4 may be data generated when the warm-up cycle is 4. In this case, the circular data DATA_4 may start from the fourth data D4. In other words, the circular data DATA_2 may include the fourth to seventh data D4 to D7 and the zeroth to seventh data D0 to D7 that are repeatedly disposed. In the case where the warm-up cycle is 4, the fourth to seventh data D4 to D7 may be sequentially output on the first to fourth cycles of the data strobe (DQS) signal. Here, the controller 200 may ignore the fourth to seventh data D4 to D7 received on the first to fourth cycles of the data strobe (DQS) signal. The zeroth to seventh data D0 to D7 may be sequentially output from the fifth cycle of the data strobe (DQS) signal. The controller 200 may normally receive the zeroth to seventh data D0 to D7 that are output from the fifth cycle of the data strobe (DQS) signal. Hence, the logic data DATA_L may be transmitted from the semiconductor memory device 100 to the controller 200.

FIG. 8 is a timing diagram more generally illustrating a plurality of pieces of circular data generated by the circular data generator 133.

Referring to FIG. 8, there is illustrated circular data that is generated in the case where the logic data DATA_L includes k pieces of unit data. In other words, the logic data DATA_L may include zeroth to k−1-th data D0 to D(k−1). Here, n may be an integer larger than 1.

The circular data DATA_0 may be data generated when the warm-up cycle is 0. In this case, the circular data DATA_0 may start from the zeroth data D0. In other words, the circular data DATA_0 may be data in which the zeroth to k−1-th data D0 to D(k−1) included in the logic data DATA_L stored in the logic data storage 131 are sequentially and repeatedly disposed.

The circular data DATA_n may be data generated when the warm-up cycle is n. Here, n may be an integer other than 0, i.e., a natural number. In this case, the circular data DATA_n may start from k−n-th data D(k−n). In other words, the circular data DATA_n may include k−n-th data to k−1-th data D(k−n) to D(k−1), and the zeroth to k−1-th data D0 to D(k−1) that are repeatedly disposed.

In the case where the warm-up cycle is n, k−n-th to k−1-th data D(k−n) to D(k−1) may be sequentially output on first to n-th cycles. Here, the controller 200 may ignore the k−n-th to k−1-th data D(k−n) to D(k−1) received on the first to n-th cycles of the data strobe (DQS) signal. The zeroth to k−1-th data D0 to D(k−1) may be sequentially output from the n+1-th cycle of the data strobe (DQS) signal. The controller 200 may normally receive the zeroth to k−1-th data D0 to D(k−1) that are output from the n+1-th cycle of the data strobe (DQS) signal. Hence, the logic data DATA_L may be transmitted from the semiconductor memory device 100 to the controller 200.

FIG. 9 is a table illustrating pieces of bit data included in the circular data.

Referring to FIG. 7, pieces of circular data DATA_0, DATA_1, DATA_2, and DATA_4 may include zeroth to seventh data D0 to D7. Each of zeroth to seventh data D0 to D7 may be unit data that is output for each cycle and may be 8-bit data.

Referring to FIG. 9, the zeroth data D0 may include pieces of zeroth unit bit data B0_0, B1_0, B2_0, . . . , B7_0. The first data D1 may include pieces of first unit bit data B0_1, B1_1, B2_1, . . . , B7_1. The second data D2 may include pieces of second unit bit data B0_2, B1_2, B2_2, . . . , B7_2. In this way, the seventh data D7 may include pieces of seventh unit bit data B0_7, B1_7, B2_7, . . . , B7_7.

The bit data B0_0 among the pieces of zeroth unit bit data B0_0, B1_0, B2_0, . . . , B7_0 may be output through the zeroth data input/output line DQ0. The bit data B0_1 among the pieces of first unit bit data B0_1, B1_1, B2_1, . . . , B7_1 may also be output through the zeroth data input/output line DQ0. In this way, the bit data B0_7 among the pieces of seventh unit bit data B0_7, B1_7, B2_7, . . . , B7_7 may also be output through the zeroth data input/output line DQ0.

The bit data B1_0 among the pieces of zeroth unit bit data B0_0, B1_0, B2_0, . . . , B7_0 may be output through the first data input/output line DQ1. The bit data B1_1 among the pieces of first unit bit data B0_1, B1_1, B2_1, . . . , B7_1 may also be output through the first data input/output line DQ1. In this way, the bit data B1_7 among the pieces of seventh unit bit data B0_7, B1_7, B2_7, . . . , B7_7 may also be output through the first data input/output line DQ1.

In this way, the bit data B7_0 among the pieces of zeroth unit bit data B0_0, B1_0, B2_0, . . . , B7_0 may be output through the seventh data input/output line DQ7. The bit data B7_1 among the pieces of first unit bit data B0_1, B1_1, B2_1, . . . , B7_1 may also be output through the seventh data input/output line DQ7. In this way, the bit data B7_7 among the pieces of seventh unit bit data B0_7, B1_7, B2_7, . . . , B7_7 may also be output through the seventh data input/output line DQ7 line.

In other wards, 8-bit data may be output through the data input/output line DQ[7:0] for each cycle of the data strobe (DQS) signal.

FIGS. 10A, 10B, 10C, and 10D are timing diagrams illustrating bit data included in each piece of circular data illustrated in FIG. 7.

Referring to FIG. 10A, there are illustrated pieces of bit data that form the circular data DATA_0. As illustrated in FIG. 10A, the circular data DATA_0 may include pieces of unit data that are sequentially output, in other words, zeroth to seventh data D0 to D7. As described above, the zeroth data D0 may include pieces of zeroth unit bit data B0_0, B1_0, B2_0, . . . , B7_0. The first data D1 may include pieces of first unit bit data B0_1, B1_1, B2_1, . . . , B7_1. The second data D2 may include pieces of second unit bit data B0_2, B1_2, B2_2, . . . , B7_2. In this way, the seventh data D7 may include pieces of seventh unit bit data B0_7, B1_7, B2_7, . . . , B7_7.

The zeroth unit bit data B0_0 of the zeroth data D0, the first unit bit data B0_1 of the first data D1, the second unit bit data B0_2 of the second data D2, etc. may be sequentially output through the zeroth data input/output line DQ0. Bit data that is output through the zeroth data input/output line DQ0 as bit data included in the circular data DATA_0 may be designated as zeroth bit stream data BS0_0.

The zeroth unit bit data B1_0 of the zeroth data D0, the first unit bit data B1_1 of the first data D1, the second unit bit data B1_2 of the second data D2, etc. may be sequentially output through the first data input/output line DQ1. Bit data that is output through the first data input/output line DQ1 as bit data included in the circular data DATA_0 may be designated as first bit stream data BS1_0.

In this way, the zeroth unit bit data B7_0 of the zeroth data D0, the first unit bit data B7_1 of the first data D1, the second unit bit data B7_2 of the second data D2, etc. may be sequentially output through the seventh data input/output line DQ1. Bit data that is output through the seventh data input/output line DQ7 as bit data included in the circular data DATA_0 may be designated as seventh bit stream data BS7_0.

In other words, the circular data DATA0 may include eight bit stream data BS0_0, BS1_0, . . . , BS7_0.

Referring to FIG. 10B, there are illustrated pieces of bit data that form the circular data DATA_1. The circular data DATA_1 may be data to which a warm-up cycle of 1 is applied. Therefore, the circular data DATA_1 may be data that is output with one-cycle difference from the circular data DATA_0. Therefore, the pieces of bit stream data BS0_1, BS1_1, . . . , BS7_1 included in the circular data DATA1 have one-cycle difference from the pieces of bit stream data BS0_0, BS1_0, . . . , BS7_0 included in the circular data DATA_0.

Likewise, referring to FIG. 10C, there are illustrated pieces of bit data that form the circular data DATA_2. The circular data DATA_2 may be data to which a warm-up cycle of 2 is applied. Therefore, the circular data DATA_2 may be data that is output with two-cycle difference from the circular data DATA_0. Therefore, the pieces of bit stream data BS0_2, BS1_2, . . . , BS7_2 included in the circular data DATA2 have two-cycle difference from the pieces of bit stream data BS0_0, BS1_0, . . . , BS7_0 included in the circular data DATA_0.

Referring to FIG. 10D, there are illustrated pieces of bit data that form the circular data DATA_4. The circular data DATA_4 may be data to which a warm-up cycle of 4 is applied. Therefore, the circular data DATA_4 may be data that is output with four-cycle difference from the circular data DATA_0. Therefore, the pieces of bit stream data BS0_4, BS1_4, . . . , BS7_4 included in the circular data DATA4 have four-cycle difference from the pieces of bit stream data BS0_0, BS1_0, . . . , BS7_0 included in the circular data DATA_0.

Figure 11:
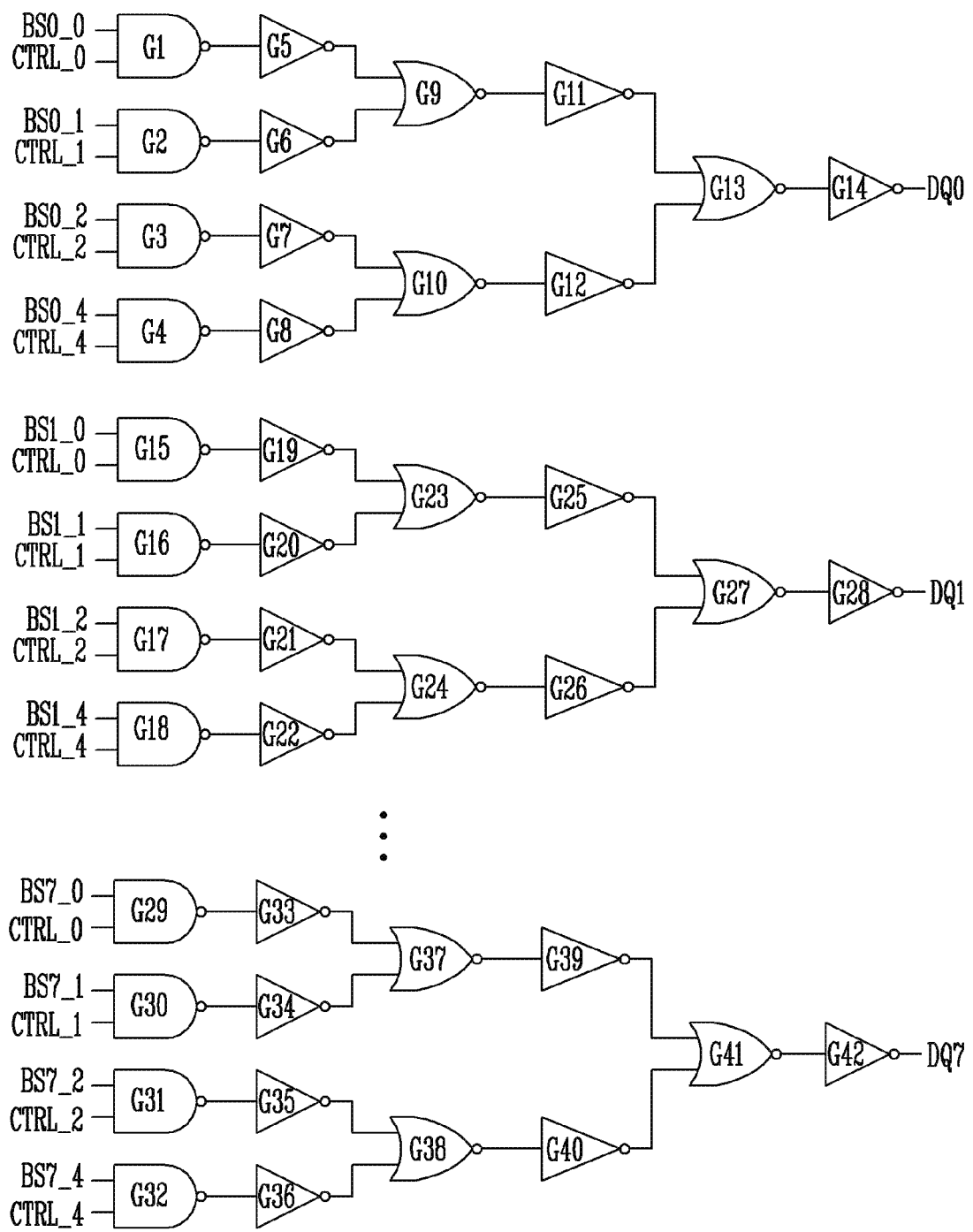
FIG. 11 is a gate level circuit diagram illustrating an embodiment of a data input/output circuit.
Figure 12:
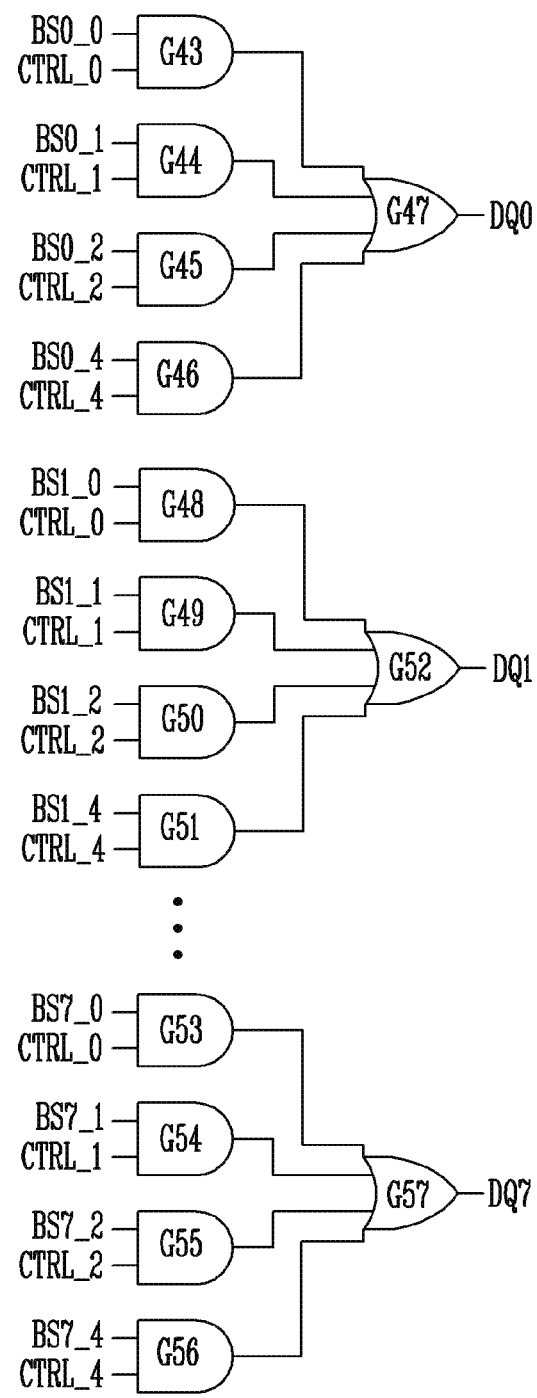
FIG. 12 is a gate level circuit diagram equivalent to the circuit diagram of FIG. 11.

FIG. 11 is a gate level circuit diagram illustrating an embodiment of the data input/output circuit 124. FIG. 12 is a gate level circuit diagram equivalent to the circuit diagram of FIG. 11. Hereinafter, description will be made with reference to FIGS. 11 and 12 together. Control signals CTRL_0, CTRL_1, CTRL_2, and CTRL_4 illustrated in FIGS. 11 and 12 may be signals included in the control signal CTRL of FIGS. 4 and 5. The control signals CTRL_0, CTRL_1, CTRL_2, and CTRL_4 may be generated by the control signal generator 137. In the case where the value of a warm-up cycle WUC received from the parameter storage 135 is 0, the control signal generator 137 may output a control signal CTRL_0 having a value of 1 and control signals CTRL_1, CTRL_2, and CTRL_4 each having a value of 0. In the case where the value of the warm-up cycle WUC received from the parameter storage 135 is 1, the control signal generator 137 may output a control signal CTRL_1 having a value of 1 and control signals CTRL_0, CTRL_2, and CTRL_4 each having a value of 0. In the case where the value of the warm-up cycle WUC received from the parameter storage 135 is 2, the control signal generator 137 may output a control signal CTRL_2 having a value of 1 and control signals CTRL_0, CTRL_1, and CTRL_4 each having a value of 0. In the case where the value of the warm-up cycle WUC received from the parameter storage 135 is 4, the control signal generator 137 may output a control signal CTRL_4 having a value of 1 and control signals CTRL_0, CTRL_1, and CTRL_2 each having a value of 0.

Referring to FIG. 11, the data input/output circuit 124 may include first to forty-second gates G1 to G42. The first to fourth gates G1 to G4, the fifteenth to eighth gates G15 to G18, and the twenty-ninth to thirty-second gates G29 to G32 may be NAND gates. The first gate G1 may receive the zeroth bit stream data BSO_0 of the circular data DATA_0 and a control signal CTRL_0, and perform a NAND operation on the zeroth bit stream data BS0_0 and the control signal CTRL_0. The second gate G2 may receive the zeroth bit stream data BSO_1 of the circular data DATA_1 and the control signal CTRL_1, and perform a NAND operation on the zeroth bit stream data BS0_1 and the control signal CTRL_1. The third gate G3 may receive the zeroth bit stream data BS0_2 of the circular data DATA_2 and the control signal CTRL_2, and perform a NAND operation on the zeroth bit stream data BS0_2 and the control signal CTRL_2. The fourth gate G4 may receive zeroth bit stream data BS00_4 of the circular data DATA_4 and a control signal CTRL_4, and perform a NAND operation on the zeroth bit stream data BS0_4 and the control signal CTRL_4. Likewise, each of the fifteen to eighteenth gates G15 to G18 may receive bit stream data BS1_0, BS1_1, BS1_2, BS1_4 and a control signal CTRL_0, CTRL_1, CTRL_2, CTRL_4, and perform a NAND operation on the bit stream data and the control signal. In this way, each of the twenty-ninth to thirty-second gates G29 to G32 may receive bit stream data BS7_0, BS7_1, BS7_2, BS7_4 and a control signal CTRL_0, CTRL_1, CTRL_2, CTRL_4, and perform a NAND operation on the bit stream data and the control signal.

The fifth to eight gates G5 to G8, the nineteenth to twenty-second gates G19 to G22, and the thirty-third to thirty-sixth gates G33 to G36 may be inverters. The fifth to eighth gates G5 to G8, the nineteenth to twenty-second gates G19 to G22, and the thirty-third to thirty-sixth gates G33 to G36 may invert the output of the first to fourth gates G1 to G4, the fifteenth to eighteenth gates G15 to G18, and the twenty-ninth to thirty-second gates G29 to G32, respectively.

The ninth to tenth gates G9 to G10, the twenty-third to twenty-fourth gates G23 to G24, and the thirty-seventh and thirty-eighth gates G37 to G38 may be NOR gates. The ninth gate G9 may receive an output of the fifth gate G5 and an output of the sixth gate G6, and perform a NOR operation on the outputs. The tenth gate G10 may receive an output of the seventh gate G7 and an output of the eighth gate G8, and perform a NOR operation on the outputs. The twenty-third gate G23 may receive an output of the nineteenth gate G19 and an output of the twentieth gate G20, and perform a NOR operation on the outputs. The twenty-fourth gate G24 may receive an output of the twenty-first gate G21 and an output of the twenty-second gate G22, and perform a NOR operation on the outputs. The thirty-seventh gate G37 may receive an output of the thirty-third gate G33 and an output of the thirty-fourth gate G34, and perform a NOR operation on the outputs. The thirty-eighth gate G38 may receive an output of the thirty-fifth gate G35 and an output of the thirty-sixth gate G36, and perform a NOR operation on the outputs.

The eleventh and twelfth gates G11 and G12, the twenty-fifth to twenty-sixth gates G25 and G26, and the thirty-ninth to fortieth gates G39 and G40 may be inverters. The eleventh and twelfth gates G11 and G12 may respectively invert outputs of the ninth and tenth gates G9 and G10. The twenty-fifth and twenty-sixth gates G25 and G26 may respectively invert outputs of the twenty-third and twenty-fourth gates G23 and G24. The thirty-ninth to fortieth gates G39 and G40 may respectively invert outputs of the thirty-seventh and thirty-eighth gates G37 and G38.

The thirteenth gate G13, the twenty-seventh gate G27, and the forty-first G41 may be NOR gates. The thirteenth gate G13 may receive an output of the eleventh gate G11 and an output of the twelfth gate G12, and perform a NOR operation on the outputs. The twenty-seventh gate G27 may receive an output of the twenty-fifth gate G25 and an output of the twenty-sixth gate G26, and perform a NOR operation on the outputs. The forty-first gate G41 may receive an output of the thirty-ninth gate G39 and an output of the fortieth gate G40, and perform a NOR operation on the outputs. The fourteenth gate G14, the twenty-eighth gate G28, and the forty-second gate G42 may be inverters. The fourteenth gate G14 may invert an output of the thirteenth gate G13 and output the output to the zeroth data output line DQ0. The twenty-eighth gate G28 may invert an output of the twenty-seventh gate G27 and output the output to the first data output line DQ1. In this way, the forty-second gate G42 may invert an output of the forty-first gate G41 and output the output to the seventh data output line DQ7.

Referring to FIG. 12, the data input/output circuit 124 may include forty-third to fifty-seventh gates G43 to G57. The forty-third to forty-sixth gates G43 to G46, the forty-eighth to fifty-first gates G48 to G51, and the fifty-third to fifty-sixth gates G53 to G56 may be AND gates.

It can be understood that the gate circuit illustrated in FIG. 11 is equivalent to the gate circuit illustrated in FIG. 12. Referring to FIGS. 11 and 12, in an embodiment, any one of the control signals CTRL0, CTRL1, CTRL2, and CTRL4 may be enabled according to a predetermined warm-up cycle, and any one of the pieces of circular data DATA_0, DATA_1, DATA_2, and DATA_4 may be output to the data input/output DQ[7:0] line based on the enabled control signal.

FIG. 13 is a table illustrating control signals CTRL_0 to CTRL_4 according to a warm-up cycle.

Referring to FIG. 13, when the warm-up cycle is 0, only the control signal CTRL_0 among the control signals CTRL_0 to CTRL_4 may have a value of 1, and the other control signals CTRL_1 to CTRL_4 each may have a value of 0. When the warm-up cycle is 1, only the control signal CTRL_1 among the control signals CTRL_0 to CTRL_4 may have a value of 1, and the other control signals CTRL_0, CTRL_2, and CTRL_4 each may have a value of 0. When the warm-up cycle is 2, only the control signal CTRL_2 among the control signals CTRL_0 to CTRL_4 may have a value of 1, and the other control signals CTRL_0, CTRL_1, and CTRL_4 each may have a value of 0. When the warm-up cycle is 4, only the control signal CTRL_4 among the control signals CTRL_0 to CTRL_4 may have a value of 1, and the other control signals CTRL_0, CTRL_1, and CTRL_2 each may have a value of 0.

As described above, in the case where the value of a warming-up cycle WUC received from the parameter storage 135 is 0, the control signal generator 137 may output a control signal CTRL_0 having a value of 1 and control signals CTRL_1, CTRL_2, and CTRL_4 each having a value of 0. In this case, for example, as shown in FIG. 12, the forty-third gate G43 may output the zeroth bit stream data BS0_0. The forty-fourth to forty-sixth gates G44 to G46 each may output a value of 0. Hence, the forty-seventh gate G47 may output the zeroth bit stream BS0_0 to the zeroth data input/output line DQ0. Similarly, the fifty-second gate G52 may output the first bit stream data BS1_0. In this way, the fifty-seventh gate G57 may output the seventh bit stream data BS7_0. As a result, OR gates G47, G52, ..., G57 may output the circular data DATA_0 to the data input/output DQ[7:0] line.

In the case where the value of the warming-up cycle WUC received from the parameter storage 135 is 1, the control signal generator 137 may output a control signal CTRL_1 having a value of 1 and control signals CTRL_0, CTRL_2, and CTRL_4 each having a value of 0. In this case, for example, as shown in FIG. 12, the forty-fourth gate G44 may output the zeroth bit stream data BS0_1. The forty-third, forty-fifth, and forty-sixth gates G43, G45, and G46 each may output a value of 0. Hence, the forty-seventh gate G47 may output the zeroth bit stream data BS0_1 to the zeroth data input/output line DQ0. Similarly, the fifty-second gate G52 may output the first bit stream data BS1_1. In this way, the fifty-seventh gate G57 may output the seventh bit stream data BS7_1. As a result, OR gates G47, G52, ..., G57 may output the circular data DATA_1 to the data input/output DQ[7:0] line.

In the case where the value of the warming-up cycle WUC received from the parameter storage 135 is 2, the control signal generator 137 may output a control signal CTRL_2 having a value of 1 and control signals CTRL_0, CTRL_1, and CTRL_4 each having a value of 0. In this case, for example, as shown in FIG. 12, the forth-fifth gate G45 may output the zeroth bit stream data BS0_2. The forty-third, forty-fourth, and forty-sixth gates G43, G44, and G46 each may output a value of 0. Hence, the forty-seventh gate G47 may output the zeroth bit stream data BS0_2 to the zeroth data input/output line DQ0. Similarly, the fifty-second gate G52 may output the first bit stream data BS1_2. In this way, the fifty-seventh gate G57 may output the seventh bit stream data BS7_2. As a result, OR gates G47, G52, ..., G57 may output the circular data DATA_2 to the data input/output DQ[7:0] line.

In the case where the value of the warming-up cycle WUC received from the parameter storage 135 is 4, the control signal generator 137 may output a control signal CTRL_4 having a value of 1 and control signals CTRL_0, CTRL_1, and CTRL_2 each having a value of 0. In this case, for example, as show in FIG. 12, the forty-sixth gate G46 may output the zeroth bit stream data BS0_4. The forty-third to forty-fifth gates G43 to G45 each may output a value of 0. Hence, the forty-seventh gate G47 may output the zeroth bit stream data BS0_4 circular data DATA_4 to the zeroth data input/output line DQ0. Similarly, the fifty-second gate G52 may output the first bit stream data BS1_4. In this way, the fifty-seventh gate G57 may output the seventh bit stream data BS7_4. As a result, OR gates G47, G52, ..., G57 may output the circular data DATA_4 to the data input/output DQ[7:0] line.

In this way, the semiconductor memory device 100 in accordance with an embodiment may generate the circular data from the logic data based on the warm-up cycle WUC. The circular data may be data circular-shifted by the number of warm-up cycles. The semiconductor memory device 100 may output, through the data input/output DQ[7:0] line, the generated circular data in response to the data strobe (DQS) signal. The circular data based on the number of warm-up cycles may be generated using the logic data DATA_L by the simple gate operation described with reference to FIGS. 9 and 10. Therefore, in the storage device 1000 to which the warm-up cycle is applied, data corresponding to the warm-up cycle set based on a simple circuit may be output. Consequently, the complexity of the semiconductor memory device 100 and the storage device 1000 including the semiconductor memory device 100 may be reduced.

FIG. 14 is a flowchart illustrating a method of operating the semiconductor memory device 100 in accordance with an embodiment of the present disclosure.

Referring to FIG. 14, the semiconductor memory device 100 may receive an output command of logic data (at step S100). At step S100, the semiconductor memory device 100 may receive the output command of the logic data from the controller 200. As described above, the output command may be a command such as ReadID (90h) or Get Feature (EEh).

At step S200, the control logic 130 of the semiconductor memory device 100 may generate a plurality of pieces of circular data DATA_0, DATA_1, DATA_2, and DATA_4 based on the logic data DATA_L. For example, the circular data generator 133 of the control logic 130 may receive the logic data DATA_L from the logic data storage 131. The circular data generator 133 may generate the pieces of circular data DATA_0, DATA_1, DATA_2, and DATA_4 that respectively correspond to a plurality of warm-up cycles. In an embodiment, the plurality of warm-up cycles may include two or more of 0, 1, 2, and 4.

At step S300, circular data corresponding to the set warm-up cycle WUC may be selected from among the pieces of generated circular data DATA_0, DATA_1, DATA_2, and DATA_4. Referring to FIG. 5, the pieces of generated circular data DATA_0, DATA_1, DATA_2, and DATA_4 may be transmitted to the data input/output circuit 124. The control signal generator 137 may transmit a control signal CTRL corresponding to the set warm-up cycle WUC to the data input/output circuit 124. The data input/output circuit 124 may select circular data corresponding to the set warm-up cycle WUC from among the pieces of generated circular data DATA_0, DATA_1, DATA_2, and DATA_4, based on the received control signal CTRL.

For example, in the case where the warm-up cycle WUC is 0, the data input/output circuit 124 may select the circular data DATA_0. In the case where the warm-up cycle WUC is 1, the data input/output circuit 124 may select the circular data DATA_1. In the case where the warm-up cycle WUC is 2, the data input/output circuit 124 may select the circular data DATA_2. In the case where the warm-up cycle WUC is 4, the data input/output circuit 124 may select the circular data DATA_4.

At step S400, the data input/output circuit 124 may output the selected circular data to the controller 200 through the data input/output DQ[7:0] line.

Figure 15:
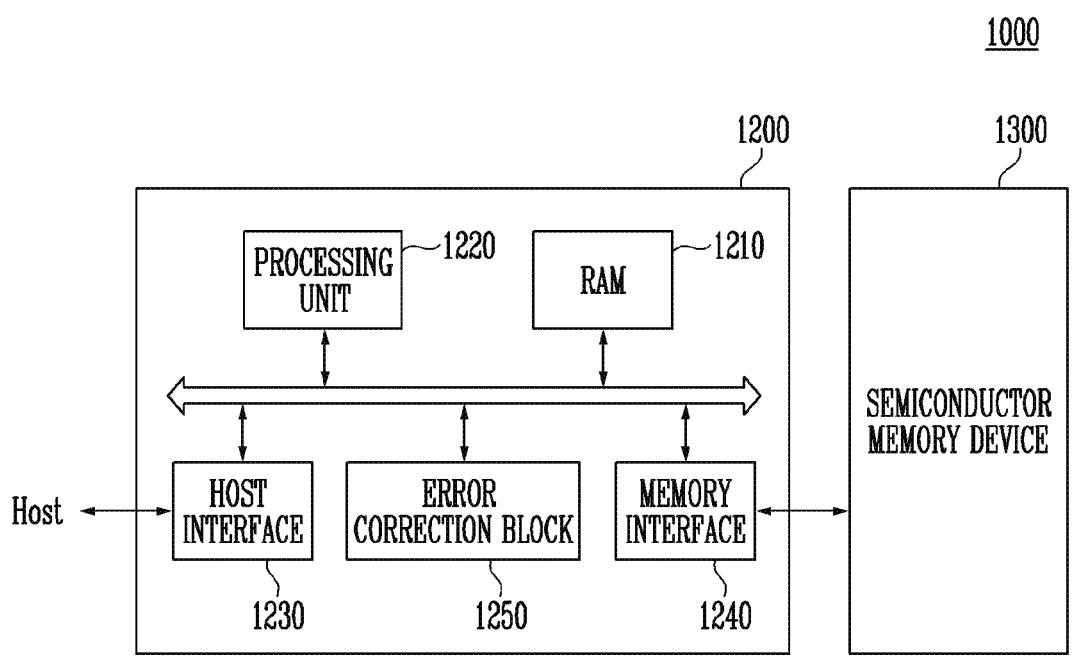
FIG. 15 is a block diagram illustrating a storage device including the semiconductor memory device and the controller.

FIG. 15 is a block diagram illustrating a storage device 1000 including a semiconductor memory device 1300 and a controller 1200.

The semiconductor memory device 1300 illustrated in FIG. 15 may have the same configuration and operation as those of the semiconductor memory devices 100 described with reference to FIG. 2. Hereinafter, repetitive explanations will be omitted.

The controller 1200 may be coupled to a host device Host and the semiconductor memory device 1300. The controller 1200 may access the semiconductor memory device 1300 in response to a request from the host device Host. For example, the controller 1200 may control a read operation, a write operation, an erase operation, and a background operation of the semiconductor memory device 1300. The controller 1200 may provide an interface between the semiconductor memory device 1300 and the host device Host. The controller 1200 may drive firmware for controlling the semiconductor memory device 1300.

The controller 1200 may include a random access memory (RAM) 1210, a processing unit 1220, a host interface 1230, a memory interface 1240, and an error correction block 1250.

The RAM 1210 is used as at least one of an operating memory for the processing unit 1220, cache memory between the semiconductor memory device 1300 and the host device Host, and buffer memory between the semiconductor memory device 1300 and the host device Host.

The processing unit 1220 may control the overall operation of the controller 1200. The processing unit 1220 may control a read operation, a program operation, an erase operation, and a background operation of the semiconductor memory device 1300. The processing unit 1220 may drive firmware for controlling the semiconductor memory device 1300. The processing unit 1220 may perform a function of a flash translation layer (FTL). The processing unit 1220 may translate a logical block address (LBA), provided by the host device, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The host interface 1230 may include a protocol for performing data exchange between the host device Host and the controller 1200. In an embodiment, the controller 1200 may be configured to communicate with the host device Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 may interface with the semiconductor memory device 1300. For example, the memory interface 1240 includes a NAND interface or a NOR interface.

The error correction block 1250 may use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When the number of error bits included in the read page data exceeds the number of correctable bits, decoding may fail. When the number of error bits included in the page data is less than or equal to the number of correctable bits, decoding may succeed. A success in decoding indicates that the corresponding read command has passed. A failure in decoding indicates that the corresponding read command has failed. When decoding succeeds, the controller 1200 may output error-corrected page data to the host device Host.

The controller 1200 and the semiconductor memory device 1300 may be integrated into a single semiconductor device. In an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCM-CIA), a compact flash card (CF), a smart media card (SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD may include a storage device configured to store data in a semiconductor memory. When the storage device is used as the SSD, an operation speed of the host device Host coupled to the storage device may be phenomenally improved.

In another embodiment, the storage device 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the storage device may be embedded in various types of packages. For example, the semiconductor memory device 1300 or the storage device may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Figure 16:
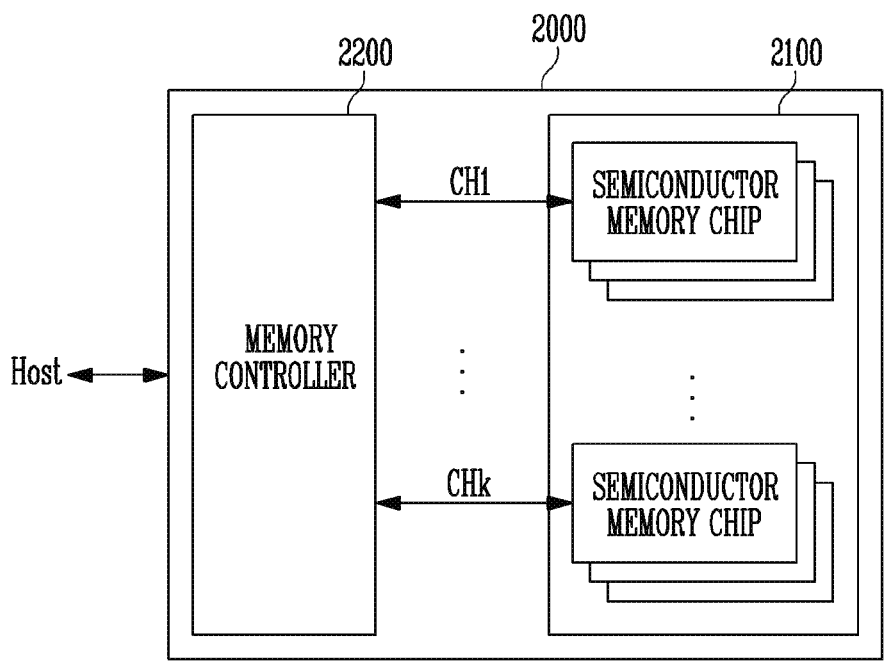
FIG. 16 is a block diagram illustrating an application example of the storage device of FIG. 15.

FIG. 16 is a block diagram illustrating an application example 2000 of the storage devices of FIG. 15.

Referring FIG. 16, the storage device 2000 includes a semiconductor memory device 2100 and a controller 2200. The semiconductor memory device 2100 includes a plurality of memory chips. The semiconductor memory chips may be divided into a plurality of groups.

In FIG. 16, it is illustrated that the plurality of groups respectively communicate with the controller 2200 through first to k-th channels CH1 to CHk. Each semiconductor memory chip may have the same configuration and operation as those of an embodiment of the semiconductor memory device 1300 described with reference to FIG. 15.

Each group may communicate with the controller 2200 through one common channel. The controller 2200 has the same configuration as that of the controller 1200 described with reference to FIG. 15 and is configured to control a plurality of memory chips of the semiconductor memory device 2100 through the plurality of channels CH1 to CHk.

In FIG. 16, a plurality of semiconductor memory chips has been illustrated as being coupled to each channel. However, it can be understood that the storage device 2000 may be modified such that a single memory chip is connected to each channel.

Figure 17:
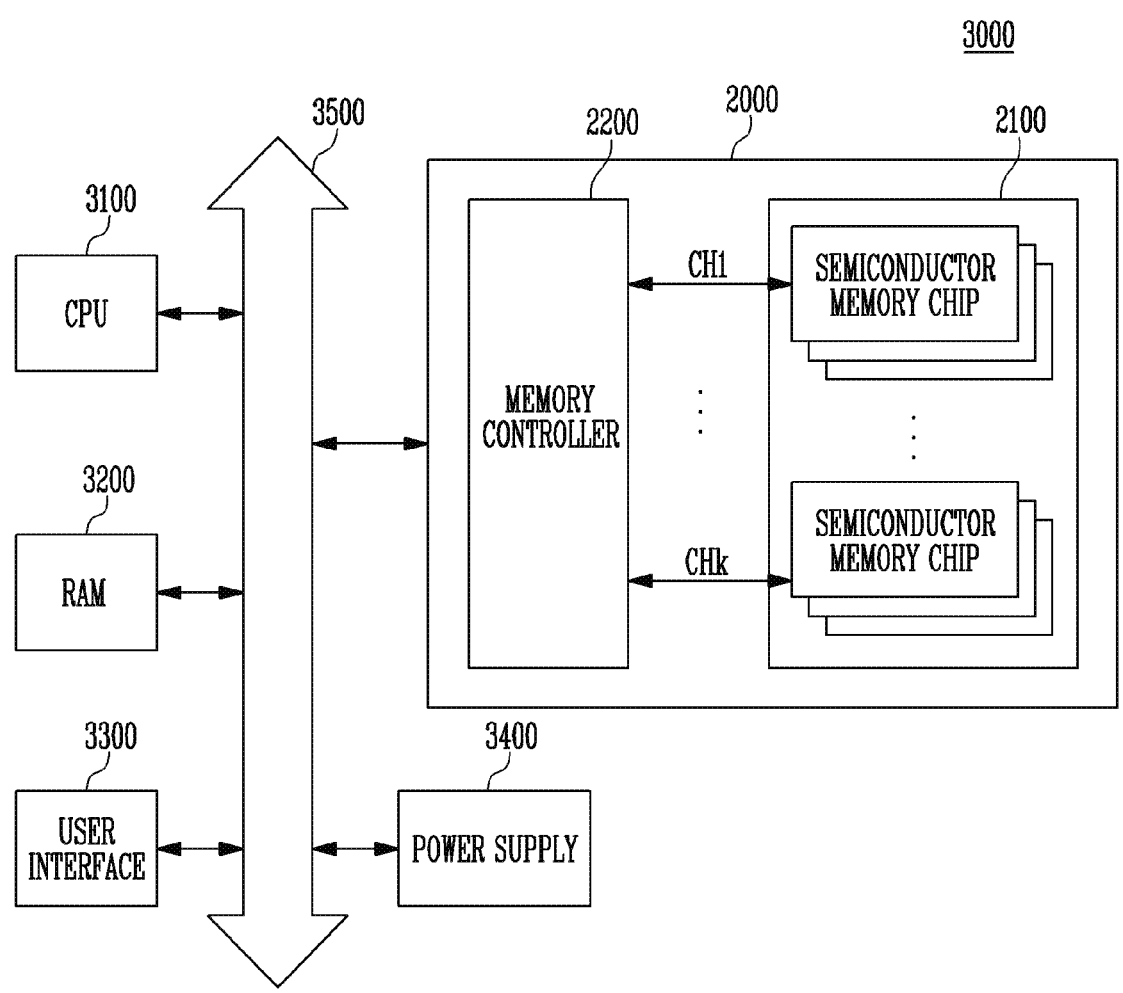
FIG. 17 is a block diagram illustrating a computing system including the storage device described with reference to FIG. 16.

FIG. 17 is a block diagram illustrating a computing system 3000 including the storage devices 2000 described with reference to FIG. 16.

Referring to FIG. 17, the computing system 3000 may include a central processing unit 3100, a RAM 3200, a user interface 3300, a power supply 3400, a system bus 3500, and a storage device 2000.

The storage device 2000 may be electrically coupled to the CPU 3100, the RAM 3200, the user interface 3300, and the power supply 3400 through the system bus 3500. Data provided through the user interface 3300 or processed by the CPU 3100 may be stored in the storage device 2000.

In FIG. 17, semiconductor memory chips 2100 have been illustrated as being coupled to the system bus 3500 through the controller 2200. However, the semiconductor chips 2100 may be directly coupled to the system bus 3500. The function of the controller 2200 may be performed by the CPU 3100 and the RAM 3200.

Referring to FIG. 17, the storage devices 2000 described with reference to FIG. 16 may be provided. However, the storage device 2000 may be replaced with the storage devices 1000 described with reference to FIG. 15. In an embodiment, the computing system 3000 may include both the storage devices 1000 and 2000 described with reference to FIGS. 15 and 16.

Various embodiments of the present disclosure may provide a semiconductor memory device having a minimized implementation area.

Various embodiments of the present disclosure may provide a method of operating a semiconductor memory device having a minimized implementation area.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device configured to be operated under control of a controller, and the semiconductor memory device comprising:
    a control logic configured to store logic data and a set warm-up cycle value, and to generate a plurality of pieces of circular data corresponding to a plurality of warm-up cycles based on the logic data in response to an output command of the logic data, the output command being received from the controller; and
    a data input and output (input/output) circuit configured to output data to the controller,
    wherein the control logic controls the data input/output circuit to select circular data corresponding to the set warm-up cycle value among the plurality of pieces of circular data, and to output the selected circular data to the controller.

2. The semiconductor memory device according to claim 1, wherein the control logic comprises:
    a logic data storage configured to store the logic data;
    a circular data generator configured to generate the plurality of pieces of circular data corresponding to the plurality of warm-up cycles based on the logic data, and to output the circular data to the data input/output circuit;
    a parameter storage configured to store the set warm-up cycle value; and
    a control signal generator configured to generate a control signal for controlling an operation of the data input/output circuit based on the set warm-up cycle value.

3. The semiconductor memory device according to claim 2, wherein the circular data generator generates the plurality of pieces of circular data by circular-shifting, by the plurality of warm-up cycles, the logic data that is iterated.

4. The semiconductor memory device according to claim 2, wherein the data input/output circuit selects any one of the plurality of pieces of circular data based on the control signal.

5. The semiconductor memory device according to claim 4,
    wherein the plurality of pieces of circular data include first to n-th circular data, the control signal includes first to n-th control signals, and the plurality of warm-up cycles include first to n-th warm-up cycles, and
    wherein, when the set warm-up cycle is an i-th warm-up cycle among the first to n-th warm-up cycles, the control signal generator generates an i-th control signal having a value of 1, and first to i−1-th and i+1 to n-th control signals each having a value of 0, and wherein n is an integer greater than 0, and i is an integer greater than 0 and less than n.

6. The semiconductor memory device according to claim 5, wherein the data input/output circuit comprises:

first to n-th first logic gates configured to receive and perform an AND logic operation on any one of the first to n-th circular data and any one of the first to n-th control signals corresponding to the first to n-th circular data; and a second logic gate configured to receive outputs of the first to n-th first logic gates and perform an OR logic operation.

7. The semiconductor memory device according to claim 5, wherein the logic data comprises zeroth to k−1-th data, and wherein circular data corresponding to a warm-up cycle having a value of j includes k−j-th to k−1-th data and zeroth to k−1-th data that are sequentially output, and wherein j is an integer equal to or greater than 0, and k is an integer greater than 1.

8. The semiconductor memory device according to claim 7, wherein the j is any one value of 0, 1, 2, and 4.

9. The semiconductor memory device according to claim 1, wherein the output command of the logic data is any one of a ReadID command and a Get Feature command.

10. A method of operating a semiconductor memory device configured to communicate with a controller, the method comprising:

receiving an output command of logic data from the controller;

generating a plurality of pieces of circular data based on the logic data;

selecting circular data corresponding to a set warm-up cycle among the plurality of pieces circular data; and outputting the selected circular data.

11. The method according to claim 10, wherein each of the plurality of pieces of circular data is generated by circular-shifting, by a corresponding warm-up cycle value, the logic data that is iterated.

12. The method according to claim 10, wherein the plurality of pieces of circular data include first to n-th circular data, the control signal includes first to n-th control signals, and the plurality of warm-up cycles include first to n-th warm-up cycles, and wherein, when the set warm-up cycle is an i-th warm-up cycle among the first to n-th warm-up cycles, the control signal generator generates an i-th control signal having a value of 1, and first to i−1-th and i+1 to n-th control signals each having a value of 0, and wherein n is an integer greater than 0, and i is an integer greater than 0 and less than n.

13. The method according to claim 12, wherein the logic data comprises zeroth to k−1-th data, and wherein circular data corresponding to a warm-up cycle having a value of j includes k−j-th to k−1-th data and zeroth to k−1-th data that are sequentially output, and wherein j is an integer equal to or greater than 0, and k is an integer greater than 1.

14. The method according to claim 13, wherein the j is any one value of 0, 1, 2, and 4.

15. The method according to claim 10, wherein an output command of the logic data is any one of a ReadID command and a Get Feature command.

* * * * *